(12) United States Patent
Yang

(10) Patent No.: US 8,051,557 B2
(45) Date of Patent: Nov. 8, 2011

(54) SUBSTRATE WITH MULTI-LAYER INTERCONNECTION STRUCTURE AND METHOD OF MANUFACTURING THE SAME

(75) Inventor: Chih-kuang Yang, Hsin-Chu (TW)

(73) Assignee: Princo Corp., Hsinchu (TW)

( * ) Notice: Subject to any disclaimer, the term of this patent is extended or adjusted under 35 U.S.C. 154(b) by 0 days.

(21) Appl. No.: 12/169,830

(22) Filed: Jul. 9, 2008

(65) Prior Publication Data

US 2008/0265405 A1 Oct. 30, 2008

Related U.S. Application Data

(62) Division of application No. 11/308,519, filed on Mar. 31, 2006, now abandoned.

(51) Int. Cl.
*H05K 3/30* (2006.01)
(52) U.S. Cl. ............. 29/841; 29/835; 257/758; 257/753
(58) Field of Classification Search .................... 29/835, 29/841; 257/758, 753
See application file for complete search history.

(56) References Cited

U.S. PATENT DOCUMENTS

| | | | |
|---|---|---|---|
| 4,388,132 A | 6/1983 | Hoge et al. | |
| 4,784,872 A * | 11/1988 | Moeller et al. ................. | 29/841 |
| 4,812,191 A | 3/1989 | Ho et al. | |
| 5,073,814 A | 12/1991 | Cole, Jr. et al. | |
| 5,258,236 A | 11/1993 | Arjavalingam et al. | |
| 5,874,780 A * | 2/1999 | Murakami ..................... | 257/775 |
| 5,897,337 A | 4/1999 | Kata et al. | |
| 6,344,162 B1 * | 2/2002 | Miyajima ................ | 264/272.14 |
| 6,571,466 B1 * | 6/2003 | Glenn et al. ..................... | 29/841 |
| 6,794,273 B2 * | 9/2004 | Saito et al. ..................... | 438/462 |
| 6,949,470 B2 * | 9/2005 | Igarashi et al. ................ | 438/754 |
| 7,030,494 B2 * | 4/2006 | Aoki .............................. | 257/758 |
| 7,222,421 B2 * | 5/2007 | Nakamura ..................... | 29/830 |
| 7,246,421 B2 * | 7/2007 | Namba et al. ................ | 29/25.35 |
| 2001/0015009 A1 * | 8/2001 | Heo ................................ | 29/840 |
| 2002/0126459 A1 * | 9/2002 | Albert et al. .................. | 361/743 |
| 2004/0040740 A1 * | 3/2004 | Nakatani et al. .............. | 174/256 |
| 2004/0152239 A1 | 8/2004 | Bao et al. | |
| 2004/0160750 A1 * | 8/2004 | Masuko ......................... | 361/761 |
| 2005/0046021 A1 * | 3/2005 | Hosokawa ..................... | 257/729 |
| 2005/0224978 A1 * | 10/2005 | Kawate et al. ................. | 257/753 |

FOREIGN PATENT DOCUMENTS

| | | | |
|---|---|---|---|
| CN | 1528009 | | 9/2004 |
| JP | 2002009202 | | 1/2002 |
| JP | 2004-87701 | | 3/2004 |
| JP | 2005-236244 | * | 9/2005 |
| JP | 2005236244 | | 9/2005 |
| JP | 2005302924 | | 10/2005 |

* cited by examiner

*Primary Examiner* — Derris Banks
*Assistant Examiner* — Jeffrey T Carley

(57) ABSTRACT

The invention provides a substrate with multi-layer interconnection structure, which includes a substrate and a multi-layer interconnection structure formed on the substrate. The multi-layer interconnection structure is adhered to the substrate in partial areas. The invention also provides a method of manufacturing and recycling such substrate and a method of packaging electronic devices by using such substrate. The invention also provides a method of manufacturing multi-layer interconnection devices.

13 Claims, 4 Drawing Sheets ion structure and a method of manufacturing such a substrate, wherein the separation of the multi-layer interconnection structure and the substrate is easy, fast, and low cost. The invention further provides a method of packaging electronic devices, which uses a substrate with multi-layer interconnection structure, and a method of recycling substrates with multi-layer interconnection structure.

SUBSTRATE WITH MULTI-LAYER INTERCONNECTION STRUCTURE AND METHOD OF MANUFACTURING THE SAME

CROSS REFERENCE TO RELATED APPLICATION

This is a division of a U.S. patent application Ser. No. 11/308,519, filed on Mar. 31, 2006.

BACKGROUND OF THE INVENTION a) Field of the Invention

The invention relates to a substrate with multi-layer interconnection structure, methods of manufacturing and recycling such substrate, a method of packaging electronic devices by using such substrate, and a method of manufacturing multi-layer interconnection devices, and more particularly, to a substrate with multi-layer interconnection structure, wherein the multi-layer interconnection structure is adhered to the substrate in partial areas, and methods of manufacturing and recycling such substrate, a method of packaging electronic devices by using such substrate, and a method of manufacturing multi-layer interconnection devices.

b) Description of the Related Art

With the advancement of semi-conductor manufacturing technology, the line width, line spacing, and size of chips become smaller and smaller, and the chips require faster transmission speed and higher output efficiency. In response thereto, better packaging technology of electrically connecting the chips to the exterior is required, wherein more wires are needed and wire spacing is smaller, and thus the technology of chip packaging slowly transforms from through hole type to surface mount type, and from connecting by gold wire in wiring frames to connecting by bumps, and circuit boards transform from hard printed circuit board (PCB), flexible printed circuit board (FPC), to integrated circuit board (IC).

In general, a hard PCB with six layers of BT material weighs about 4 grams and has a thickness of about 1 mm, and therefore it cannot be bent; on the other hand, a FPC board with a thickness of about 50 .mu.m can only make two layers of interconnection. On the contrary, an IC board with a thickness of about 50 .mu.m can be manufactured into a substrate with six layers of interconnection that weigh about 0.21 grams in total, and so the IC board has the best flexibility and is the most compact. Moreover, in regard to interconnection density, the minimum diameter of the through holes of the hard PCB and the FPC board is 50 .mu.m, the minimum dimension of the through hole bonding pads of the hard PCB and the FPC board is 100 .mu.m, and the minimum line width and the minimum line spacing are 25 .mu.m. In contrast, the minimum diameter of through holes of the IC board is 20 .mu.m, its minimum through hold bonding pad is 25 .mu.m, and the minimum line width and minimum line spacing are 20 .mu.m; hence, the IC board greatly increases the density of interconnection.

The miniaturization of circuit board sizes causes the request of circuit board precision to increase, so the manufacturing process of circuit boards faces new challenges, especially the challenge of how to increase the wiring density in the manufacturing process is very important, and the key to increase the wiring density is the stability of circuit board size in the manufacturing process. A conventional solution is to manufacture IC boards on a hard substrate, which uses the better size stability of the substrate to increase the size stability of the IC board during the process, however, how to separate the IC board and the substrate after the fabrication of IC board is complete is a major issue for this type of technology.

U.S. Pat. No. 4,812,191 discloses a method of manufacturing multi-layer interconnection structure by using a sacrificial substrate fabrication technique, wherein a multi-layer interconnection structure is formed on a substrate that has a smaller coefficient of thermal expansion than that of the multi-layer interconnection, and then the temperature is elevated to perform curing, after which the temperature is lowered to generate enough tension between the substrate and the multi-layer interconnection structure before the multi-layer interconnection structure is separated from the substrate by adhering a support device to the multi-layer interconnection structure and by acid-immersion.

U.S. Pat. No. 5,258,236 discloses a method for separating substrate and multi-layer interconnection structure by using laser ablation. First, a polymer layer 2, a metal layer 3, and a multi-layer interconnection structure 4 are sequentially formed on a transparent substrate 1 as shown in FIG. 1; second, a laser ultraviolet light is irradiated on the polymer layer 2 through the transparent substrate 1 to dissolve the polymer layer 2 so that the transparent substrate 1 can be removed from the rest of the structure.

However, the aforementioned separation method is more complicated, thus, how to provide a method and structure that can manufacture IC boards with high size precision and can separate the IC board and the substrate in an easy and low cost way is the goal to be achieved by the circuit board manufacturing industry.

SUMMARY OF THE INVENTION

An object of the invention is to provide a substrate with multi-layer interconnection structure and a method of manufacturing such a substrate, wherein the separation of the multi-layer interconnection structure and the substrate is easy, fast, and low cost. The invention further provides a method of packaging electronic devices, which uses a substrate with multi-layer interconnection structure, and a method of recycling substrates with multi-layer interconnection structure.

An embodiment of the invention provides a substrate with multi-layer interconnection structure, the invention including: a substrate; and a multi-layer interconnection structure formed on the substrate, wherein the multi-layer interconnection structure is adhered to the substrate in partial areas. The partial areas can be a periphery region of the substrate, or can be in a form of spots or grids, etc.

Another embodiment of the invention provides a method of manufacturing a substrate with multi-layer interconnection structure, the method including: providing a substrate; and forming a multi-layer interconnection structure on the substrate, wherein the multi-layer interconnection structure is adhered to the substrate in partial areas. The partial areas can be a periphery region of the substrate, or can be in a form of spots or grids, etc.

Another embodiment of the invention provides a method of packaging electronic devices, which uses the aforementioned substrate with multi-layer interconnection structure, the packaging method including: electrically connecting at least one electronic device to the substrate with multi-layer interconnection structure; applying a sealing compound on the electronic device; and cutting the multi-layer interconnection structure so that a multi-layer interconnection device having packaged electronic device separates from the substrate afterwards. When there is a plurality of electronic devices, the step of applying a sealing compound on the plurality of electronic devices is to apply a sealing compound on specific areas of the substrate with multi-layer interconnection structure where the plurality of electronic devices are located, such that the remaining area is untreated so as to maintain the flexibility of the multi-layer interconnection device having packaged electronic devices.

Another embodiment of the invention provides a method of packaging electronic devices, which uses the aforementioned substrate with multi-layer interconnection structure, the packaging method including: cutting the multi-layer interconnection structure so that a multi-layer interconnection device separates from the substrate afterwards; electrically connecting at least one electronic device to the multi-layer interconnection device; and applying a sealing compound on the electronic device. When there is a plurality of electronic devices, the step of applying a sealing compound on the plurality of electronic devices is to apply a sealing compound on specific areas of the multi-layer interconnection device where the plurality of electronic devices are located, such that the remaining area is untreated so as to maintain the flexibility of the multi-layer interconnection device having packaged electronic devices.

Another embodiment of the invention provides a method of recycling the aforementioned substrate with multi-layer interconnection structure, the recycling method including: providing a substrate with multi-layer interconnections structure; and removing the multi-layer interconnection structure from the substrate, wherein part of the multi-layer interconnection structure has been cut and removed. In the removing step, the multi-layer interconnection structure can be removed from the substrate by using a mixed solution of sulfuric acid and hydrogen peroxide, by way of polishing, or ripping.

Another embodiment of the invention provides a method of manufacturing multi-layer interconnection devices, the method including: providing a substrate; forming a multi-layer interconnection structure on the substrate, wherein the multi-layer interconnection structure is adhered to the substrate in partial areas; and cutting the multi-layer interconnection structure so that a multi-layer interconnection device separates from the substrate afterwards. The partial areas can be a periphery region of the substrate, or can be in a form of spots or grids.

Through the technical means of the invention, a multi-layer interconnection device can be manufactured more easily, faster, and with lower cost in comparison with the conventional technology where the multi-layer interconnection structure is separated from the substrate with complicated methods such as by using a solvent and laser.

DETAILED DESCRIPTION OF THE INVENTION

Figure 1:
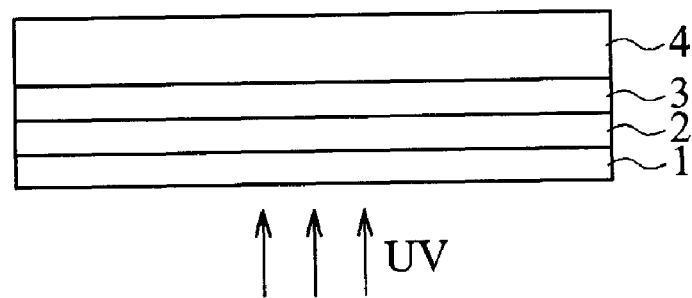
FIG. 1 shows a conventional method of separating a multi-layer interconnection structure from a substrate by laser ablation.

The preferred embodiments of the invention will be described below with reference to the drawings, wherein the like reference numerals denote the like components.

Figure 2:
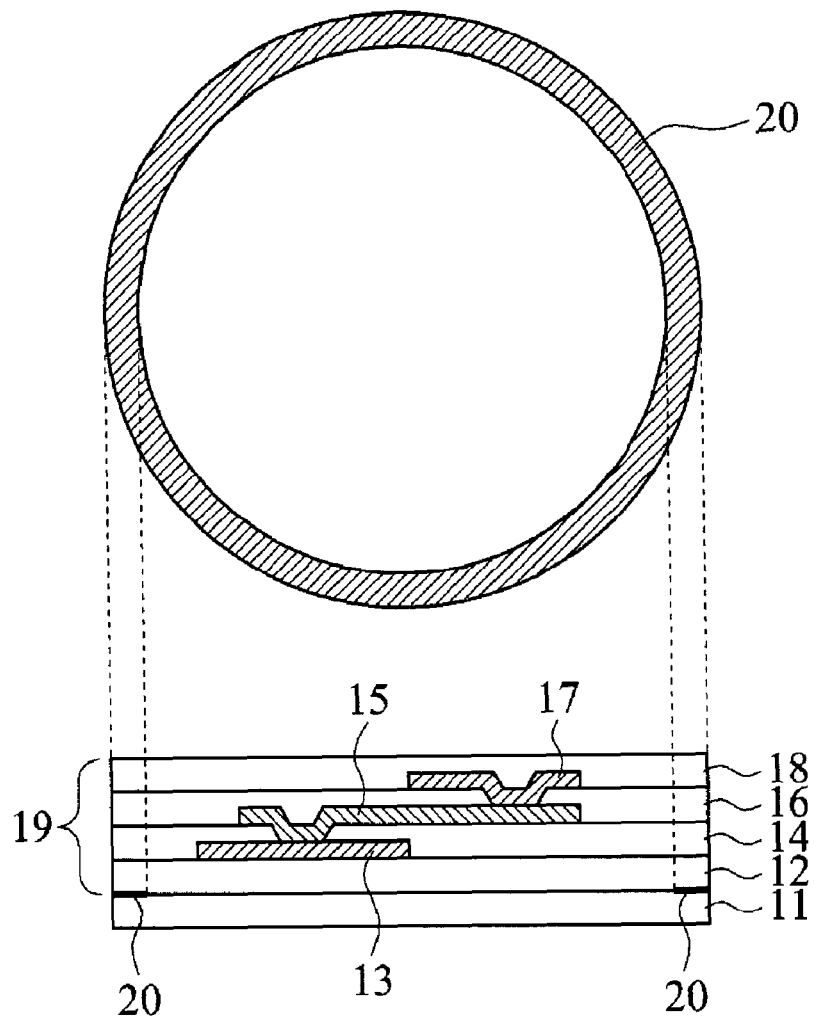
FIG. 2 shows a top view and a cross-sectional view of a substrate with multi-layer interconnection structure of the invention.

FIG. 2 illustrates a top view and a cross-sectional view of a substrate with multi-layer interconnection structure of the invention. The multi-layer interconnection structure used as an illustration in this embodiment is a double-sided IC board that has both of its front side and back side electrically connected to the exterior. Inside this double-sided IC board, the front side of the IC board electrically connects to the back side of the IC board, but the multi-layer interconnection structure can be interconnected by other methods, such as interconnecting in multiple places on one surface, or in other conditions. Moreover, the number of layers in the multi-layer interconnection structure is not limited; it can be appropriately adjusted according to different applications.

It is to be noted that in FIG. 2, a multi-layer interconnection structure 19 is used as an IC board, but a person skilled in the art knows that a multi-layer interconnection structure can be cut in subsequent processes to make hundreds and thousands of IC boards, the simplification herein is for easy illustration and description purposes.

In this embodiment, a six-inch silicon wafer is used as a substrate 11 and the multi-layer interconnection structure 19 is formed by sequentially stacking dielectric layers and metal layers on the substrate 11, wherein each of the dielectric layers 12, 14, 16 and 18 is polyimide (PI) with low-dielectric constant and a thickness of 8 .mu.m; the upper metal layer 17 and the lower metal layer 13 are under bump metal (UBM) with Cr/Cu/Ni/Au structure for subsequent electrical connection to solder balls; and the middle metal layer 15 is multi-layer metal wires of Cr/Cu/Cr.

The dielectric layers 14, 16, or 18 of the multi-layer interconnection structure can be perforated by etching or laser drilling so that the metal interconnection can be electrically connected therein, or electrically connected to the exterior.

The substrate 11 and the dielectric layer 12 are adhered together in a periphery region 20; this kind of technology that selectively adheres two surfaces in partial areas is referred to as selective-area adhering. In the embodiment, before the dielectric layer 12 is spin coated on the substrate 11, a silane adhesion promoter (DuPont VM-651) is applied on the periphery region of the substrate 11 to enhance the adhesion between the substrate 11 and the dielectric layer 12, and by leaving the remaining area of the substrate 11 untreated, the effect of selective-area adhering needed by the invention is achieved.

It is to be noted that the substrate in the invention can be all types of solid material, including metal, glass, ceramic, silicon wafer, sapphire substrate, gallium arsenide, PI, etc. The dielectric layers can be any organic material, including PI, benzo-cyclobutene (BCB), poly methyl-methacrylate (PMMA), liquid crystal polymer (LCP), etc. For the application of packaging substrates, low-dielectric constant and low-dielectric loss are advantageous in high-speed and high efficiency packaging application, and selecting material with suitable mechanical properties, such as coefficient of thermal expansion (CTE) and Young's modulus, to match with the mechanical properties of electronic devices and multi-layer interconnection devices further enhances the reliability of packaged products. The dielectric layers can be coated by way of spin coating, extrusion coating, or roller coating. The metal interconnection can be made by methods like etching, metal lift-off, etc.

In the invention, the selective-area adhering can be achieved by using the original characteristic of the surface of the substrate, or by using surface-ability enhancement method like plasma treatment, or by using material that enhances the interaction and crosslink between interface particles, like coating a silane promoter. Table 1 illustrates examples of various selective-area adhering methods that can be selected for different substrate materials and dielectric material; however, the adhering method is not limited thereto.

TABLE 1

| Substrate Material | Dielectric Layer | Adhering Method | Non-adhered Area |
|---|---|---|---|
| Silicon<br>Silicon Dioxide<br>Glass<br>Silicon Nitride<br>Aluminum | Polyimide | Apply a silane promoter | Untreated |
| Silicon | Polyimide | 1. Coat with special polyimide<br>2. Allow for curing<br>3. Perform all-round plasma treatment<br>4. Coat with dielectric layer | Untreated, and during the plasma treatment, no mask is needed for shielding |
| Silicon<br>Silicon Dioxide<br>Glass<br>Silicon Nitride<br>Aluminum<br>Ceramic | Polyimide | Form a chromium film by physical vapor deposition (PVD) | Untreated, and during the plating of the chromium film, no mask is needed for shielding |

Next, a packaging method, which uses the aforementioned substrate with multi-layer interconnection structure to electrically connect with electronic devices, is described.

Figure 3A:
FIG. 3 shows a method of packaging electronic devices that are electrically connected to a substrate with multi-layer interconnection structure of the invention.
Figure 3B:
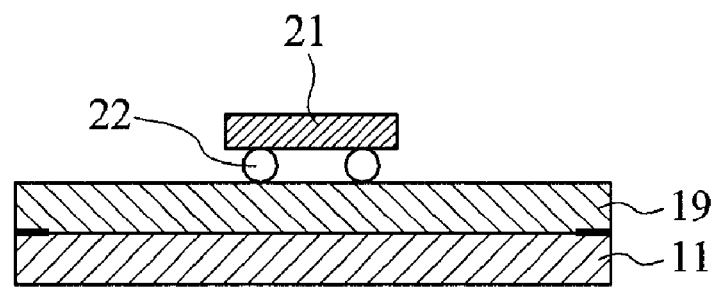
Figure 3C:
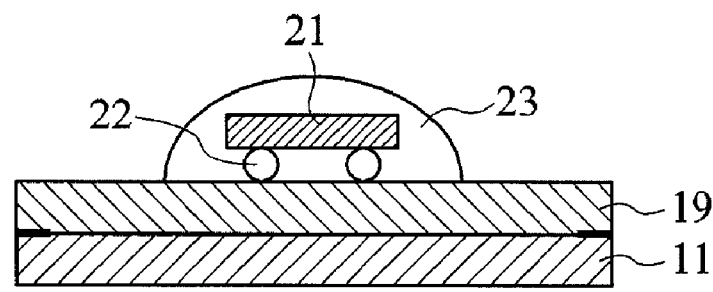
Figure 3D:
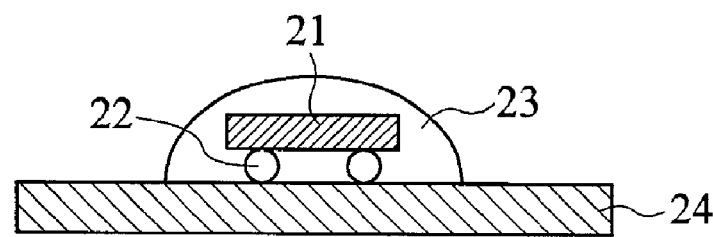

FIGS. 3A to 3D illustrate a method of packaging electronic devices that are electrically connected to the substrate with multi-layer interconnection structure of the invention. FIG. 3A shows a substrate 11 with multi-layer interconnection structure 19 of the invention, wherein the multi-layer interconnection structure 19 can be tested first to ensure the functionality of its interconnection; then, as shown in FIG. 3B, an electronic device 21 is electrically connected to the multi-layer interconnection structure 19 by flip-chip bonding with bumps 22. It is to be noted that the number of electronic devices to be packaged is not limited to, and the type of electronic devices is not limited to integrated circuits only—other devices like passive devices and printed circuit boards (PCB) can be the devices that electrically connect to the multi-layer interconnection structure 19. Furthermore, other methods can be selected as the bonding method for electrical connection, for example, wiring, anisotropic conductive film (ACF), surface mount technology (SMT), ball grid array (BGA), land grid array (LGA), pin grid array (PGA), etc. Subsequently, as shown in FIG. 3C, the electronic device 21 is packaged with a sealing compound 23, and the sealing compound can be epoxy molding, Dam & Fill Epoxy, Dam & Fill Silicone, etc. The sealing compound is not required to be applied on the entire multi-layer interconnection structure 19; it can be applied in a way such that appropriate areas can remain untreated to keep the flexibility of the multi-layer interconnection structure 19 at certain places according to the needs of different applications. At last, as shown in FIG. 3D, after the multi-layer interconnection structure 19 is cut at appropriate places, a multi-layer interconnection device 24 having packaged electronic device 21 is directly separated from the substrate 11. For the double-sided IC board of the embodiment, the back side of the IC board needs to be drilled by laser so that the UBM can electrically connect to the exterior and thus the packaging of electronic device is complete.

Figure 4A:
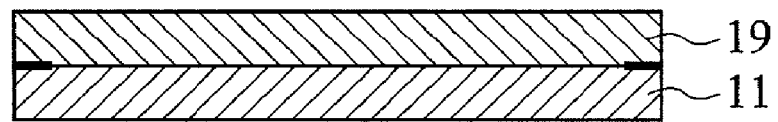
FIG. 4 shows another method of packaging electronic devices that are electrically connected to a substrate with multi-layer interconnection structure of the invention.
Figure 4B:
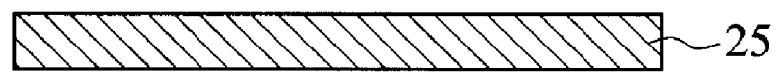
Figure 4C:
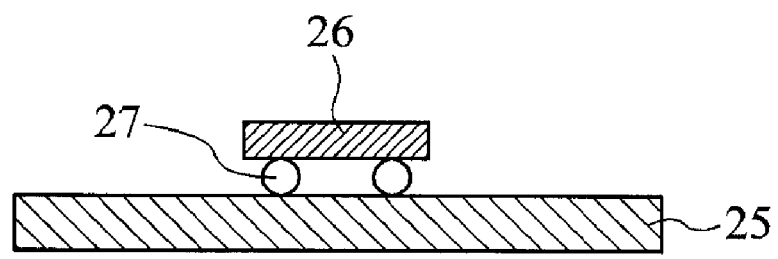
Figure 4D:
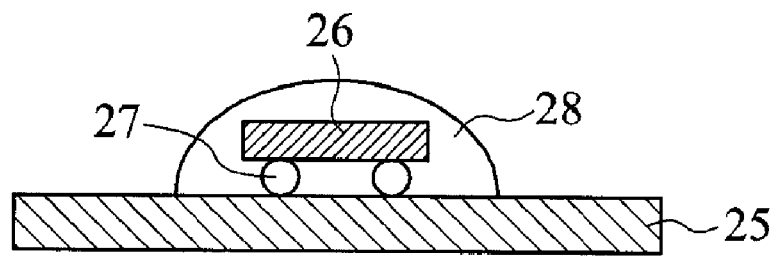

FIGS. 4A to 4D show another method of packaging electronic devices that are electrically connected to the substrate with multi-layer interconnection structure of the invention. FIG. 4A illustrates the substrate 11 with multi-layer interconnection structure 19 of the invention; then, FIG. 4B shows a multi-layer interconnection device 25 that is directly separated from the substrate 11 after the multi-layer interconnection structure 19 is cut at appropriate places. For the double-sided IC board of the invention, the back side of the IC board needs to be laser drilled so that the UBM can electrically connect to the exterior, and the multi-layer interconnection device 25 can be tested first to ensure the functionality of its interconnection. Next, as shown in FIG. 4C, an electronic device 26 is electrically connected to the multi-layer interconnection device 25 by flip-chip bonding with bumps 27. As aforementioned, the number of electronic devices to be packaged is not limited to one, and the type of electronic devices is not limited to just integrated circuits—other devices like passive devices and PCBs can be the devices that electrically connect to the multi-layer interconnection device 25 of the invention. Moreover, other methods can be selected as the bonding method for electrical connection, such as wiring, ACF, SMT, BGA, LGA, PGA, etc. Next, as shown in FIG. 4D, the electronic device 26 is packaged with a sealing compound 28, and as aforementioned, the sealing compound 28 can be epoxy molding, Dam & Fill Epoxy, Dam & Fill Silicon, etc. The sealing compound is not required to cover the entire multi-layer interconnection device 25; it can be applied in a way such that appropriate areas can remain untreated to keep the flexibility of the multi-layer interconnection device 25 at certain places according to the needs of different applications and thus the packaging of electronic devices is complete.

The aforementioned embodiment describes packaging electronic devices on the multi-layer interconnection device of the invention, and the application of the multi-layer interconnection device of the invention is not limited thereto. The multi-layer interconnection device of the invention can further be used as an intermediate layer connecting electronic devices and PCB, an intermediate layer connecting PCBs, an intermediate layer between a plurality of electrically connected electronic devices, or a multi-layer interconnection device electrically connecting to other multi-layer interconnection devices.

Figure 5:
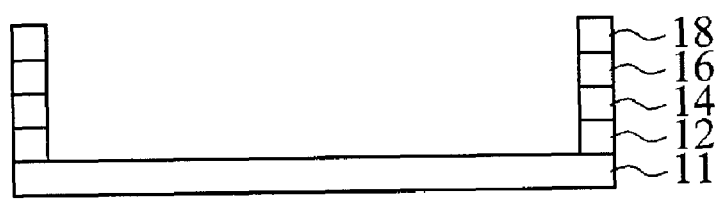
FIG. 5 shows the remaining of a substrate with multi-layer interconnection structure after being used in a packaging method of the invention.

Another embodiment of the invention further includes a method of recycling substrates with multi-layer interconnection structure. FIG. 5 shows the remaining of a substrate with multi-layer interconnection structure after the substrate has undergone the two aforementioned packaging methods. The substrate and the multi-layer interconnection structure can be separated by applying different methods of removing and separating multi-layer interconnection structures to the abovementioned remaining of the substrate with multi-layer interconnection structure. For example, the removal and separation methods can be: immersing the remaining of the substrate with multi-layer interconnection structure in a mixed solution of sulfuric acid and hydrogen peroxide; polishing the remaining of the substrate with multi-layer interconnection structure to remove the multi-layer interconnection structure; or directly ripping off the multi-layer interconnection structure; and so the substrate can be recycled and reused.

Figure 6:
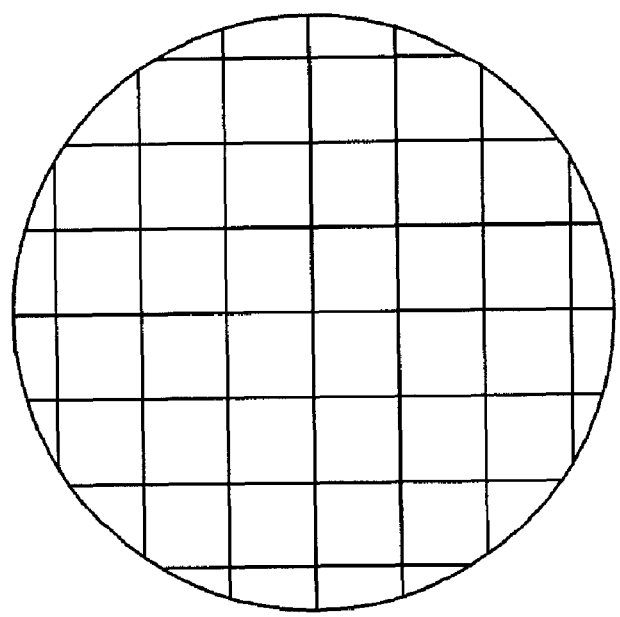
FIG. 6 shows the adhered area of selective-area adhering of the invention in a form of grids.
Figure 7:
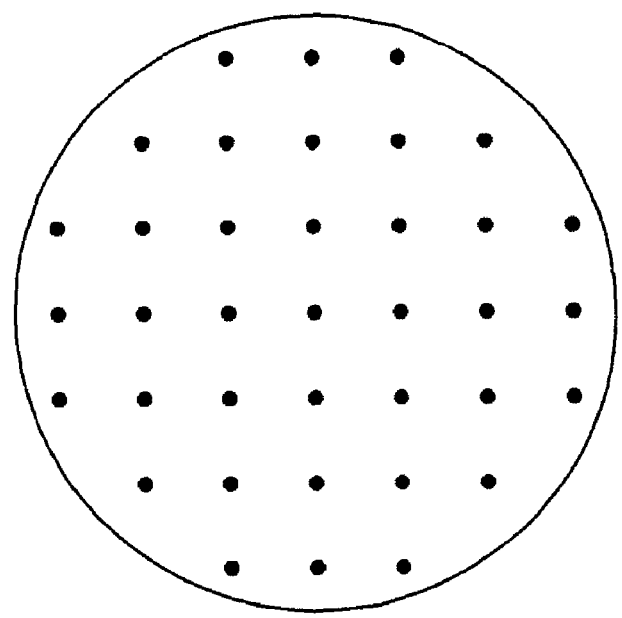
FIG. 7 shows the adhered area of selective-area adhering of the invention in a form of spots.

The adhered area of the selective-area adhering method is not limited to the periphery region described in the aforementioned embodiments; it can be in any shape, such as in grids or spots, so long as defects likes bubbling and delamination do not occur in subsequent processes. FIG. 6 shows the adhered area of the selective-area adhering method of the invention being in a form of grids, and FIG. 7 shows the adhered area of the selective-area adhering method of the invention being in a form of spots.

While the invention has been described by way of example and in terms of the preferred embodiment, it is to be understood that the invention is not limited to the disclosed embodiments. In other words, it is intended to include equivalent modifications and changes of the above embodiments without departing from the spirit and scope of the invention as would be apparent to those skilled in the art. Therefore, the scope of the appended claims should be accorded the broadest interpretation so as to encompass all such equivalent modifications and changes.

What is claimed is:

1. A method of packaging electronic devices, comprising:
providing a substrate;
adhering a region of the substrate to a first dielectric layer by treating the region of the substrate with an adhering method while leaving a remaining area of the substrate untreated;
sequentially stacking dielectric layers and metal layers on the substrate to form a multi-layer interconnection structure, wherein a first part of each metal layer is in contact with another metal layer, and wherein a second part of each metal layer is located between different dielectric layers;
electrically connecting at least one electronic device to the multi-layer interconnection structure;
packaging the electronic device with a sealing compound; and
cutting the multi-layer interconnection structure so that a multi-layer interconnection device having a packaged electronic device is separated from the substrate, wherein cutting lines are outside the treated region of the substrate.

2. The method of packaging electronic devices as described in claim 1, wherein when there are a plurality of electronic devices, the step of applying a sealing compound on the plurality of electronic devices is to apply a sealing compound on specific areas of the substrate with multi-layer interconnection structure where the electronic devices are located, so that another remaining area has no sealing compound thereon, thereby maintaining the flexibility of the multi-layer interconnection device having packaged electronic devices.

3. A method of packaging electronic devices, comprising:
providing a substrate;
adhering a region of the substrate to a first dielectric layer by treating the region of the substrate with an adhering method while leaving a remaining area of the substrate untreated;
sequentially stacking dielectric layers and metal layers on the substrate to form a multi-layer interconnection structure, wherein a first part of each metal layer is in contact with another metal layer, and wherein a second part of each metal layer is located between different dielectric layers;
cutting the multi-layer interconnection structure so that a multi-layer interconnection device is separated from the substrate, wherein cutting lines are outside the treated region of the substrate;
electrically connecting at least one electronic device to the multi-layer interconnection device; and
packaging the electronic device with a sealing compound.

4. The method of packaging electronic devices as described in claim 3, wherein when there are a plurality of electronic devices, the step of applying a sealing compound on the plurality of electronic devices is to apply a sealing compound on specific areas of the multi-layer interconnection device where the electronic devices are located, so that another remaining area has no sealing compound thereon, thereby maintaining the flexibility of the multi-layer interconnection device having packaged electronic devices.

5. A method of manufacturing multi-layer interconnection devices, comprising:
providing a substrate;
adhering a region of the substrate to a first dielectric layer by treating the region of the substrate with an adhering method while leaving a remaining area of the substrate untreated;
sequentially stacking dielectric layers and metal layers on the substrate to form a multi-layer interconnection structure, wherein a first part of each metal layer is in contact with another metal layer, and wherein a second part of each metal layer is located between different dielectric layers; and
cutting the multi-layer interconnection structure so that a multi-layer interconnection device is separated from the substrate, wherein cutting lines are outside the treated region of the substrate.

6. The method of manufacturing multi-layer interconnection devices as described in claim 5, wherein the partial areas refer to a periphery region of the substrate.

7. The method of manufacturing multi-layer interconnection devices as described in claim 5, wherein the partial areas are in a form of spots.

8. The method of manufacturing multi-layer interconnection devices as described in claim 5, wherein the partial areas are in a form of grids.

9. The method of manufacturing multi-layer interconnection devices as described in claim 5, wherein the multi-layer interconnection structure is flexible.

10. The method of manufacturing multi-layer interconnection devices as described in claim 5, wherein the first dielectric layer comprises a polyimide and the substrate material is selected from a group consisting of a silicon, a silicon dioxide, a glass, a silicon nitride, and an aluminum, and wherein the adhering method in the adhering step is to apply a silane promoter.

11. The method of manufacturing multi-layer interconnection devices as described in claim 5, wherein the first dielectric layer comprises a polyimide and the substrate material comprises a silicon, and wherein the adhering method in the adhering step is to coat with another dielectric layer.

12. The method of manufacturing multi-layer interconnection devices as described in claim 11, wherein said another dielectric layer is a polyimide layer.

13. The method of manufacturing multi-layer interconnection devices as described in claim 5, wherein the first dielectric layer comprises a polyimide and the substrate material is selected from a group consisting of a silicon, a silicon dioxide, a glass, a silicon nitride, an aluminum, and a ceramic, and wherein the adhering method in the adhering step is to form a chromium film by physical vapor deposition.

* * * * *